(12) United States Patent
Brindle

(10) Patent No.: US 6,426,525 B1
(45) Date of Patent: Jul. 30, 2002

(54) FET STRUCTURES HAVING SYMMETRIC AND/OR DISTRIBUTED FEEDFORWARD CAPACITOR CONNECTIONS

(75) Inventor: Christopher N. Brindle, Dracut, MA (US)

(73) Assignee: Tyco Electronics Corporation, Middletown, PA (US)

( * ) Notice: Subject to any disclaimer, the term of this patent is extended or adjusted under 35 U.S.C. 154(b) by 0 days.

(21) Appl. No.: 09/966,189

(22) Filed: Sep. 28, 2001

Related U.S. Application Data

(60) Provisional application No. 60/284,546, filed on Apr. 18, 2001.

(51) Int. Cl.$^7$ .................. H01L 27/108; H01L 29/76; H01L 29/94; H01L 31/119
(52) U.S. Cl. .................. 257/300; 257/331; 257/401
(58) Field of Search .................. 257/288, 296, 257/300, 307, 308, 327, 331, 355, 356, 401, 532

(56) References Cited

U.S. PATENT DOCUMENTS 5,955,763 A * 9/1999 Lin .................. 257/355
6,002,156 A * 12/1999 Lin .................. 257/356
6,285,070 B1 * 9/2001 Corisis et al. .................. 257/277

FOREIGN PATENT DOCUMENTS

JP 405291309 A * 11/1993

* cited by examiner

*Primary Examiner*—Olik Chaudhuri
*Assistant Examiner*—Hoai Pham

(57) ABSTRACT

A FET structure includes a FET including a gate having a plurality of gate fingers, a plurality of source fingers, and a plurality of drain fingers; and a feedforward capacitor electrically coupled with the FET for evenly or symmetrically distributing capacitance of the feedforward capacitor to the gate fingers and reducing the effect of distributed resistance along the gate.

23 Claims, 7 Drawing Sheets

FET STRUCTURES HAVING SYMMETRIC AND/OR DISTRIBUTED FEEDFORWARD CAPACITOR CONNECTIONS

RELATED APPLICATION

The present application claims the benefit of priority based on U.S. Provisional Application No. 60/284,546, filed on Apr. 18, 2001, owned by the assignee of the present invention, and entitled "Symmetric and Distributed Connection of Feedforward Capacitors", which is herein fully incorporated by reference.

FIELD OF THE INVENTION

The present invention relates to field effect transistor (FET) structures and, more particularly, to FET structures having symmetric and/or distributed feedforward capacitor connections.

BACKGROUND OF THE INVENTION

One type of conventional FET structure uses serpentine gates. A feedforward capacitor with a low impedance can be used to improve the harmonic noise rejections of the FETs. By improving the harmonic noise rejections, signal distortions and noise interferences can be reduced or eliminated, and the performance of the FET structures can be improved greatly. To this end, a feedforward capacitor is connected between one side of a serpentine gate and the closest drain/source bar of a FET in a FET structure to improve the harmonic rejection characteristics of the FET structure. FIGS. 1A and 1B are top plan views of two different examples of such conventional serpentine FET structures having conventional feedforward capacitor connections. As shown, a conventional serpentine FET structure 5 or 7 includes a feedforward capacitor 18 and a FET 19 coupled with the feedforward capacitor 18. The feedforward capacitor 18 includes a bottom metal layer 10, a dielectric layer (not shown) disposed on the bottom metal layer 10, and a top metal layer 15 disposed on the dielectric layer. The FET 19 includes a drain manifold 14 having drain fingers 14a, a source manifold 16 having source fingers 16a, and a serpentine gate 12 serpentining between the drain and source fingers 14a and 16a.

In the FET structure 5 shown in FIG. 1A, the top metal layer 15 is integrally connected to the drain manifold 14. That is, the top metal layer 15 functions as the drain manifold 14 of the FET 19 and as the top metal layer of the feedforward capacitor 18. The serpentine gate 12 of the FET 19 includes one end 12a directly connected to the bottom metal layer 10 of the feedforward capacitor 18, and the other end 12b indirectly connected to the feedforward capacitor 18 through the serpentining portion of the gate 12.

FIG. 1B shows an alternate topology for an FET structure 7 in which the capacitor 18 and the FET 19 are not integrally connected. The capacitor is, however, electrically connected between the capacitor top plate 15 and the FET drain/source manifold 14. The gate 12 is connected at end 12a to the capacitor bottom plate 10.

Although effective, such conventional serpentine FET structures having the conventional feedforward capacitor connection are somewhat problematic. For example, since only one end of the serpentine gate is directly connected to the feedforward capacitor, the effects of the feedforward capacitor are disproportionately applied across the FET. The end 12a of the serpentine gate 12, which is directly connected to the feedforward capacitor 18, tends to see the low impedance of the feedforward capacitor 18, while the other end 12b of the serpentine gate 12, which is not directly connected to the feedforward capacitor 18, tends to see a much higher impedance. The other end 12b experiences a higher impedance because it will experience the impedance of the feedforward capacitor 18 as well as the series gate resistance associated with the serpentine gate 12. The series gate resistance encountered by the end 12b of the serpentine gate 12 reduces or cancels out the positive effect of the feedforward capacitor 18, such that the benefits of having the feedforward capacitor 18 in the FET structure cannot be effectively realized. Further, since the series gate resistance of the serpentine gate increases as the length of the serpentine gate increases, this problem becomes more significant in large FETs having long serpentine gates.

Accordingly, there is a need for a feedforward capacitor connecting technique for FET structures which overcomes problems associated with conventional feedforward capacitor connecting techniques.

SUMMARY OF THE INVENTION

The present invention provides FET structures which overcome the above-described problems and other problems associated with conventional FET structures. Particularly, in one preferred embodiment, a bussed gate having gate fingers that are directly connected to a feedforward capacitor is used in the FET structure. This distributes evenly or symmetrically the capacitance of the feedforward capacitor to all the gate fingers, so that the effects of the feedforward capacitor can be realized throughout the gate fingers to improve the harmonic rejection characteristics of the FET. Furthermore, since the present invention improves the harmonic noise rejections of the FET structure, the desired linearity in the FET structure can be easily achieved using low control voltages, thereby increasing the efficiency and effectiveness of the FET structure. Thus, the present invention provides a simple technique which effectively solves the problems encountered in prior art FET structures and which is particularly useful in large FET structures having lengthy serpentine gates.

Accordingly, the present invention is directed to a structure comprising a FET including a gate having a plurality of gate fingers, a plurality of source fingers, and a plurality of drain fingers; and a feedforward capacitor integrally coupled with the FET for evenly or symmetrically distributing capacitance of the feedforward capacitor to the gate fingers.

DETAILED DESCRIPTION OF THE PREFERRED EMBODIMENTS

The following embodiments of the present invention are exemplary embodiments and illustrate various structures and methods for feedforward application on single gate devices and multi-gate devices. A 'direct connection' between two components means that there are no other components bridging the two components and that the two components are in contact with each other and extend directly from each other.

Figure 2A:
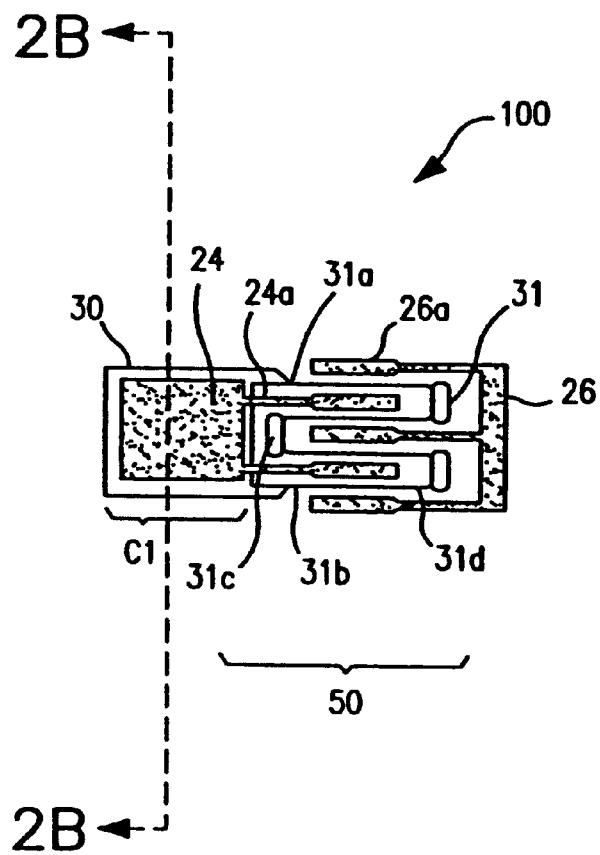
FIG. 2A is a top plan view of a FET structure according to a first embodiment of the present invention.
Figure 2B:
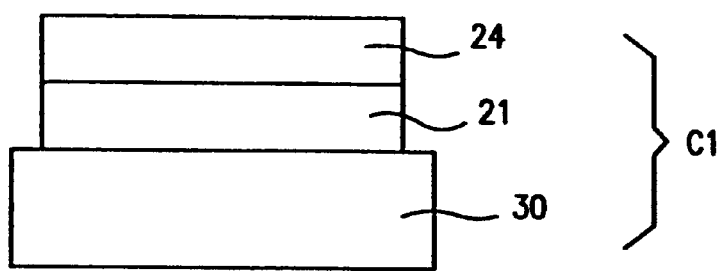
FIG. 2B is a cross-sectional view of a feedforward capacitor of the FET structure along line 2B—2B of FIG. 2A according to one embodiment of the present invention.

FIG. 2A is a top plan view of a FET structure 100 according to a first embodiment of the present invention, and FIG. 2B is a cross-sectional view of a feedforward capacitor of the FET structure cut along line 2B—2B of FIG. 2A according to one embodiment of the present invention. As shown, the FET structure 100 includes a feedforward capacitor C1 and a serpentine FET 50 integrally coupled with the feedforward capacitor C1. The feedforward capacitor C1 includes a capacitor bottom metal layer 30, a dielectric layer 21 formed on the bottom metal layer 30, and a capacitor top metal layer 24 formed on the dielectric layer 21. The serpentine FET 50 includes the capacitor top metal layer 24 (or a portion thereof) functioning as a drain manifold for providing a plurality of drain fingers 24a, a source manifold 26 having a plurality of source fingers 26a, and a serpentine gate 31 having a plurality of gate fingers 31d serpentining between the drain and source fingers 24a and 26a.

The serpentine gate 31 includes two end portions 31a and 31b which are directly connected to the bottom metal layer 30 of the feedforward capacitor C1, and a middle portion 31c which is not directly connected to any part of the feedforward capacitor C1. This direct and symmetrical connection of the serpentine gate 31 (i.e., the direction connection of the end portions 31a and 31b to the metal layer 30) to the feedforward capacitor C1 allows the feedforward capacitance of the capacitor C1 to be applied symmetrically to both sides of the serpentine gate 31. No one side of the serpentine gate 31 will be subject to the series gate resistance of the serpentine gate 31. Instead, both sides of the serpentine gate 31 will benefit equally from the feedforward capacitance of the capacitor C1. This reduces or eliminates signal distortions and improves the linearity and harmonic noise rejection characteristics of the FET structure 100.

Thus, the present invention improves greatly the performance of the FET structure. Furthermore, since the present invention improves the harmonic noise rejections of the FET structure, the desired linearity in the FET structure can be easily achieved using low control voltages, thereby increasing the efficiency and effectiveness of the FET structure.

Figure 3:
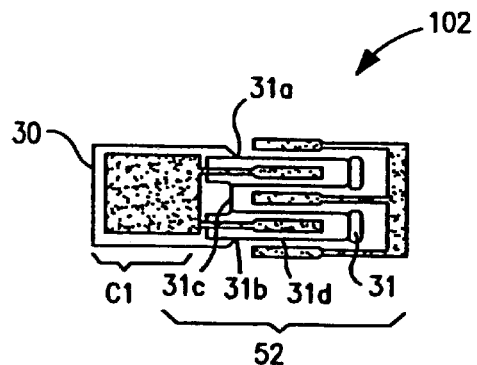
FIG. 3 is a top plan view of a FET structure according to a second embodiment of the present invention.

FIG. 3 is a top plan view of a FET structure 102 according to a second embodiment of the present invention. As shown, the FET structure 102 includes a feedforward capacitor C1 and a serpentine FET 52 integrally coupled with the feedforward capacitor C1. The FET structure 102 is identical to the FET structure 100 of FIG. 2A, except that the middle portion 31C of the serpentine gate 31 as well as the two end portions 31a and 31b thereof are connected directly to the bottom metal layer 30 of the feedforward capacitor C1. This results in all the gate fingers 31d of the serpentine gate 31 being directly connected to the bottom metal layer 30 of the feedforward capacitor C1. This configuration distributes evenly (i.e., in equal or approximately equal amount) and symmetrically the feedforward capacitance of the capacitor C1 across all the gate fingers 31d of the serpentine gate 31, thereby improving significantly the performance characteristics of the FET structure 102.

Figure 4:
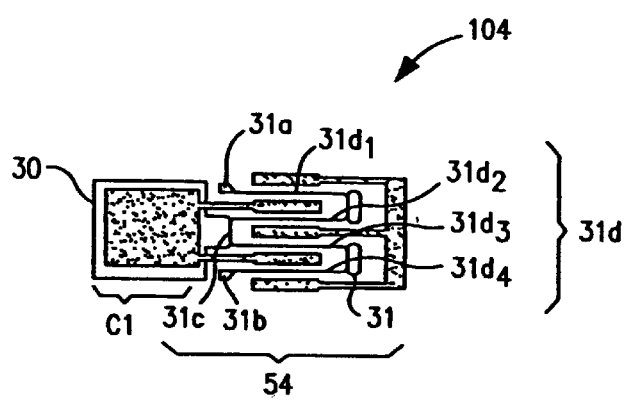
FIG. 4 is a top plan view of a FET structure according to a third embodiment of the present invention.

FIG. 4 is a top plan view of a FET structure 104 according to a third embodiment of the present invention. As shown, the FET structure 104 includes a feedforward capacitor C1 and a serpentine FET 54 integrally coupled with the feedforward capacitor C1. The FET structure 104 is identical to the FET structure 102 of FIG. 3, except that the two end portions 31a and 31b of the serpentine gate 31 are not directly connected to the bottom metal layer 30 of the feedforward capacitor C1. In other words, only the middle portion 31C of the serpentine gate 31 (and not the two end portions 31a and 31b of the serpentine gate 31) is connected directly to the feedforward capacitor C1. This results in the inner gate fingers $31d_2$ and $31d_3$ (and not the outer gate fingers $31d_1$ and $31d_4$) of the serpentine gate 31 to be in direct connection with the feedforward capacitor C1. The manner in which one side (i.e., the fingers $31d_1$ and $31d_2$) of the serpentine gate 31 is connected to the feedforward capacitor C1 is the same as the manner in which the other side (i.e., the fingers $31d_3$ and $31d_4$) of the serpentine gate 31 is connected to the feedforward capacitor C1. Thus, a symmetry in configuration exists between the two sides of the serpentine gate 31. This configuration symmetrically distributes the feedforward capacitance of the feedforward capacitor C1 to the gate fingers 31d of the serpentine gate 31, and thereby improves the performance characteristics of the FET structure 104.

In other embodiments, other portion(s) of the serpentine gate 31, except the two end portions 31a and 31b of the serpentine gate 31, can be connected directly to the feedforward capacitor C1 as long as this connection provides symmetry in the connection of the serpentine gate 31 to the feedforward capacitor C1. These configurations distribute symmetrically the feedforward capacitance of the capacitor C1 to the serpentine gate 31.

Figure 5:
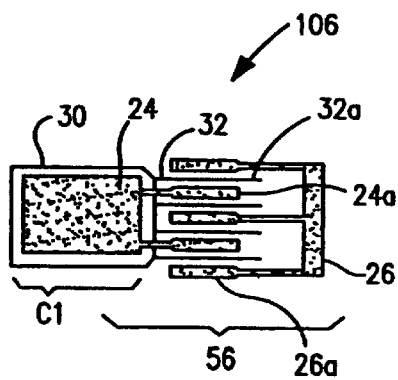
FIG. 5 is a top plan view of a FET structure according to a fourth embodiment of the present invention.

FIG. 5 is a top plan view of a FET structure 106 according to a fourth embodiment of the present invention. In this embodiment, instead of having a serpentine FET having a serpentine gate, a bussed FET having a bussed gate is used in a FET structure to connect with a feedforward capacitor. Particularly, as shown, the FET structure 106 includes a feedforward capacitor C1 and a bussed FET 56 integrally coupled with the feedforward capacitor C1. The bussed FET 56 includes a source manifold 26 having source fingers 26a, a capacitor bottom metal layer/drain manifold 24 having drain fingers 24a, and a bussed gate 32 having bussed gate fingers 32a disposed between the drain and source fingers 24a and 26a. All the gate fingers 32a of the bussed gate 32 are directly connected to the bottom metal layer 30 of the feedforward capacitor C1. This allows the feedforward capacitance of the feedforward capacitor C1 to be evenly and symmetrically distributed across all the gate fingers 32a, which improves the performance of the FET structure 106 as discussed above.

Figure 6:
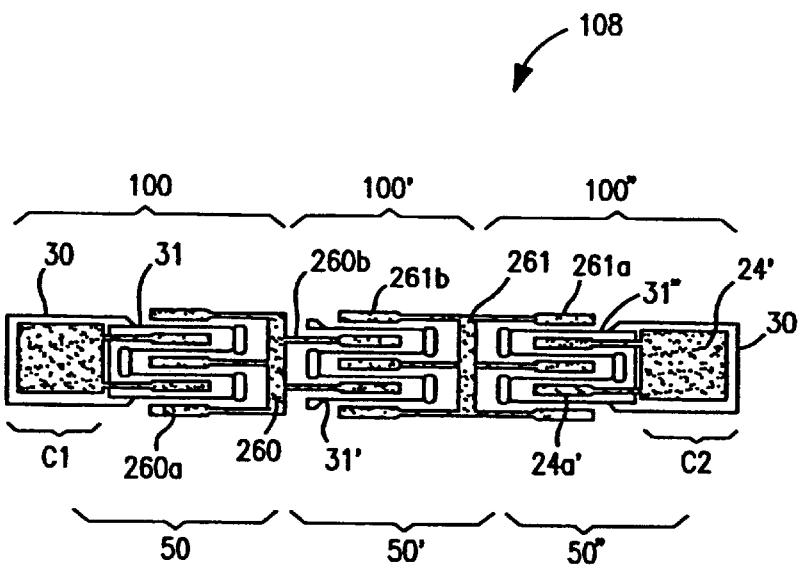
FIG. 6 is a top plan view of a FET structure according to a fifth embodiment of the present invention.

FIG. 6 is a top plan view of a cascaded FET structure 108 according to a fifth embodiment of the present invention. As shown, the cascaded FET structure 108 includes first, second and third FET structures 100, 100' and 100" that are connected in series with each other. To connect the first FET structure 100 in series with the second FET structure 100', a source manifold 260 is used wherein the source manifold 260 has a plurality of first source fingers 260*a* extending in one direction and a plurality of second source fingers 260*b* extending in the opposite direction. To connect the second FET structure 100' in series with the third FET structure 100", a drain manifold 261 is used. The drain manifold 261 has a plurality of first drain fingers 261*a* extending in one direction and a plurality of second drain fingers 261*b* extending in the opposite direction.

The first FET structure 100 is identical to the FET structure shown in FIG. 2A and includes the feedforward capacitor C1 and the serpentine FET 50. The FET 50 includes a serpentine gate 31 having two end portions that are directly connected to the bottom metal layer 30 of the feedforward capacitor C1. The first source fingers 260*a* of the source manifold 260 function as the source fingers of the FET 50. The second FET structure 100' includes a second FET 50'. The second FET 50' includes the second source fingers 260*b* of the source manifold 260 as its source fingers, the second drain fingers 261*b* of the drain manifold 261 as its drain fingers, and a second serpentine gate 31' serpentining between the source and drain fingers 260*b* and 261*b*.

The third FET structure 100" includes a third FET 50" and a second feedforward capacitor C2 integrally coupled with the third FET 50". The second feedforward capacitor C2 is identical to the first feedforward capacitor C1, except that its capacitor top metal layer 24' functions as the source manifold for providing source fingers 24*a*'. The third FET 50" includes the source manifold/top metal layer 24' having the source fingers 24*a*', the drain manifold 261 having the first drain fingers 261*a*, and a third serpentine gate 31". Both ends of the third serpentine gate 31" are connected directly to the bottom metal layer 30 of the second feedforward capacitor C2, which symmetrically distributes the feedforward capacitance of the feedforward capacitor C2 to the gate fingers of the third serpentine gate 31". It should be noted that the FET structure 100" is basically identical to the FET structure 100, except that the source and drain sides are switched.

As discussed above, for each of the feedforward capacitors C1 and C2, the two ends of the corresponding serpentine gate are connected directly to the feedforward capacitor C1 or C2 whereby the feedforward capacitance effects of the feedforward capacitors C1 and C2 are symmetrically applied to the corresponding serpentine gate, thereby greatly improving the performance of the cascaded FET structure 108.

Figure 7:
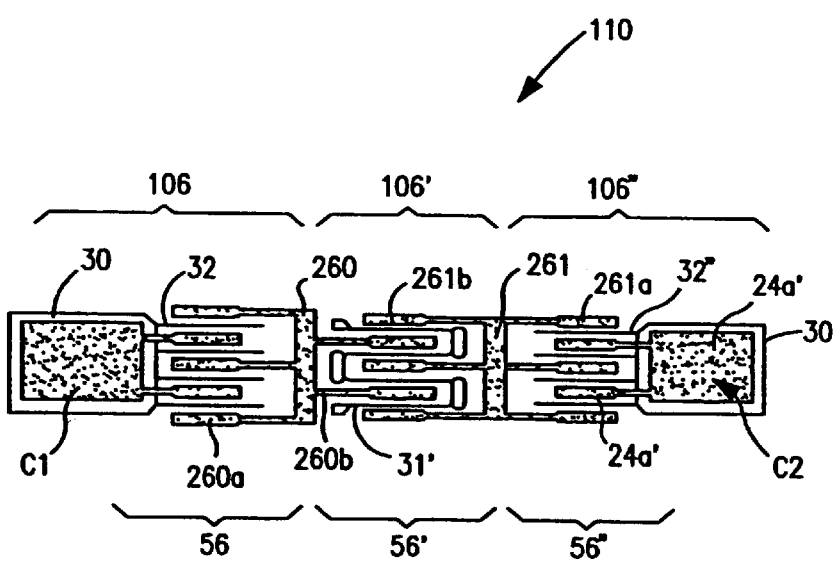
FIG. 7 is a top plan view of a FET structure according to a sixth embodiment of the present invention.

FIG. 7 is a top plan view of a cascaded FET structure 110 according to a sixth embodiment of the present invention. The cascaded FET structure 110 is identical to the cascaded FET structure 108 shown in FIG. 6, except that bussed FETs are used in lieu of serpentine FETs on both sides of the cascaded connection. Particularly, as shown in FIG. 7, the cascaded FET structure 110 includes first, second and third FET structures 106, 106' and 106" that are connected in series with each other. The first FET structure 106 is identical to the FET structure shown in FIG. 5 and includes the feedforward capacitor C1 and the bussed FET 56. The FET 56 includes a first bussed gate 32 having bussed gate fingers directly connected to the bottom metal layer 30 of the feedforward capacitor C1. The first source fingers 260*a* of the source manifold 260 function as the source fingers of the FET 56.

The second FET structure 106' is identical to the second FET structure 100' in FIG. 6, and includes a second FET 56' having a serpentine gate 31', second source fingers 260*b*, and second drain fingers 261*b*.

The third FET structure 106" includes a third FET 56" and a second feedforward capacitor C2 integrally coupled with the third FET 56". The third FET 56" includes a source manifold 24' having source fingers 24*a*', a drain manifold 261 having first drain fingers 261*a*, and a bussed gate 32". All the gate fingers of the bussed gate 32" are connected directly to the bottom metal layer 30 of the second feedforward capacitor C2, which symmetrically and evenly distributes the feedforward capacitance of the feedforward capacitor C2 to the gate fingers of the bussed gate 32". One skilled in the art would note that the third FET structure 106" is basically identical to the first FET structure 106, except that the source and drain sides are switched.

For each of the feedforward capacitors C1 and C2 in the cascaded FET structure 110, all the gate fingers of the corresponding bussed gate are connected directly to the feedforward capacitor C1 or C2 whereby the feedforward capacitance effects of the feedforward capacitors C1 and C2 are evenly and symmetrically distributed to the corresponding bussed gate fingers. This improves greatly the performance characteristics of the cascaded FET structure 110.

In other embodiments, the FET structures 100 and 100" of the cascaded FET structure 108 shown in FIG. 6 can be substituted with other FET structures such as the FET structure 102 or 104 shown in FIGS. 3 and 4. For instance, the FET structures 100 and 100" can be replaced with two FET structures 102 or two FET structures 104. In still other embodiments, a mixed combination of the FET structures 100, 102, 104 and 106 may be used in one cascaded FET structure. In all these embodiments, any number of FET structures can be cascaded to produce a cascaded FET structure.

Figure 8:
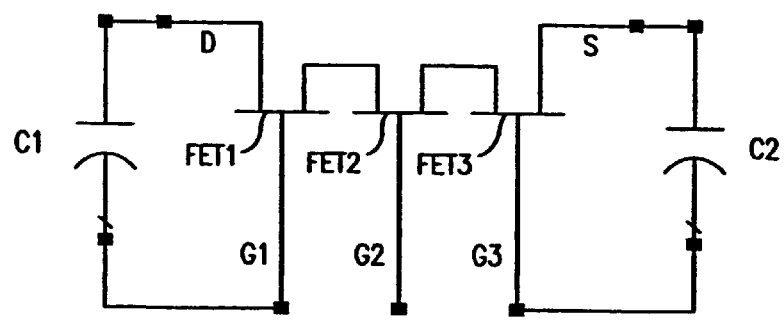
FIG. 8 is a schematic circuit diagram of the structure shown in FIG. 6 or 7 according to one embodiment of the present invention.

FIG. 8 is a schematic circuit diagram of the cascaded FET structure 108 or 110 shown in FIG. 6 or 7 according to one embodiment of the present invention. This circuit diagram clearly indicates that, in the cascaded FET structure 108, the serpentine gates 31, 31' and 31" respectively correspond to the gates G1, G2 and G3 in the circuit diagram. The FETs 50, 50' and 50" respectively correspond to the FETs FET1, FET2, and FET3. Similarly, in the cascaded FET structure 110, the bussed gate 32, the serpentine gate 31' and the bussed gate 32" respectively correspond to the gates G1, G2 and G3 in the circuit diagram. The FETs 56, 56' and 56" respectively correspond to the FETs FET1, FET2, and FET3.

Figure 9:
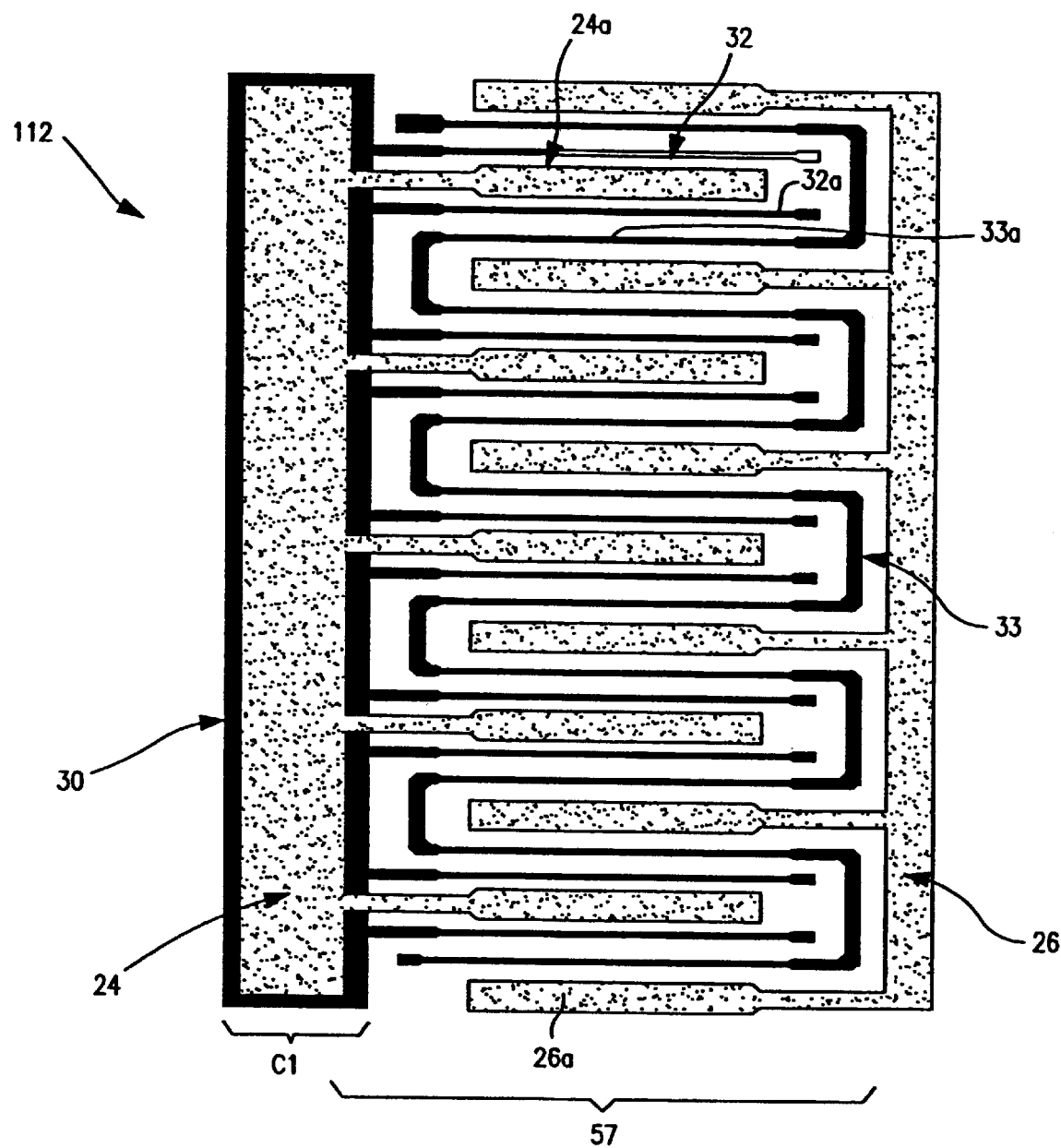
FIG. 9 is a top plan view of a FET structure according to a seventh embodiment of the present invention.

FIG. 9 is a top plan view of a multi-gate FET structure 112 according to a seventh embodiment of the present invention. As shown, the multi-gate FET structure 112 includes a feedforward capacitor C1 and a multi-gate FET 57 integrally coupled with the feedforward capacitor C1. As discussed above, the feedforward capacitor C1 includes a capacitor bottom metal layer 30, a capacitor top metal layer/drain manifold 24, and a dielectric layer 21 (FIG. 2B) disposed between the layers 24 and 30. The multi-gate FET 57 includes the drain manifold 24 having drain fingers 24*a*, a source manifold 26 having source fingers 26*a*, a bussed gate having bussed gate fingers 32*a* directly connected to the capacitor bottom metal layer 30, and a serpentine gate 33 having serpentine gate fingers 33*a*. The serpentine gate 33 serpentines between the gate fingers 32*a* and the drain or source fingers 24*a* or 26*a*. There exists one bussed gate finger 32*a* and one serpentine gate finger 33*a* between each drain finger 24*a* and an adjacent source finger 26*a*. Since all the gate fingers 32*a* are directly connected to the bottom metal layer 30 of the feedforward capacitor C1, the feedforward capacitance of the capacitor C1 is evenly and symmetrically distributed to the gate fingers 32a of the gate 32, thereby improving the performance of the FET structure 112.

Figure 10:
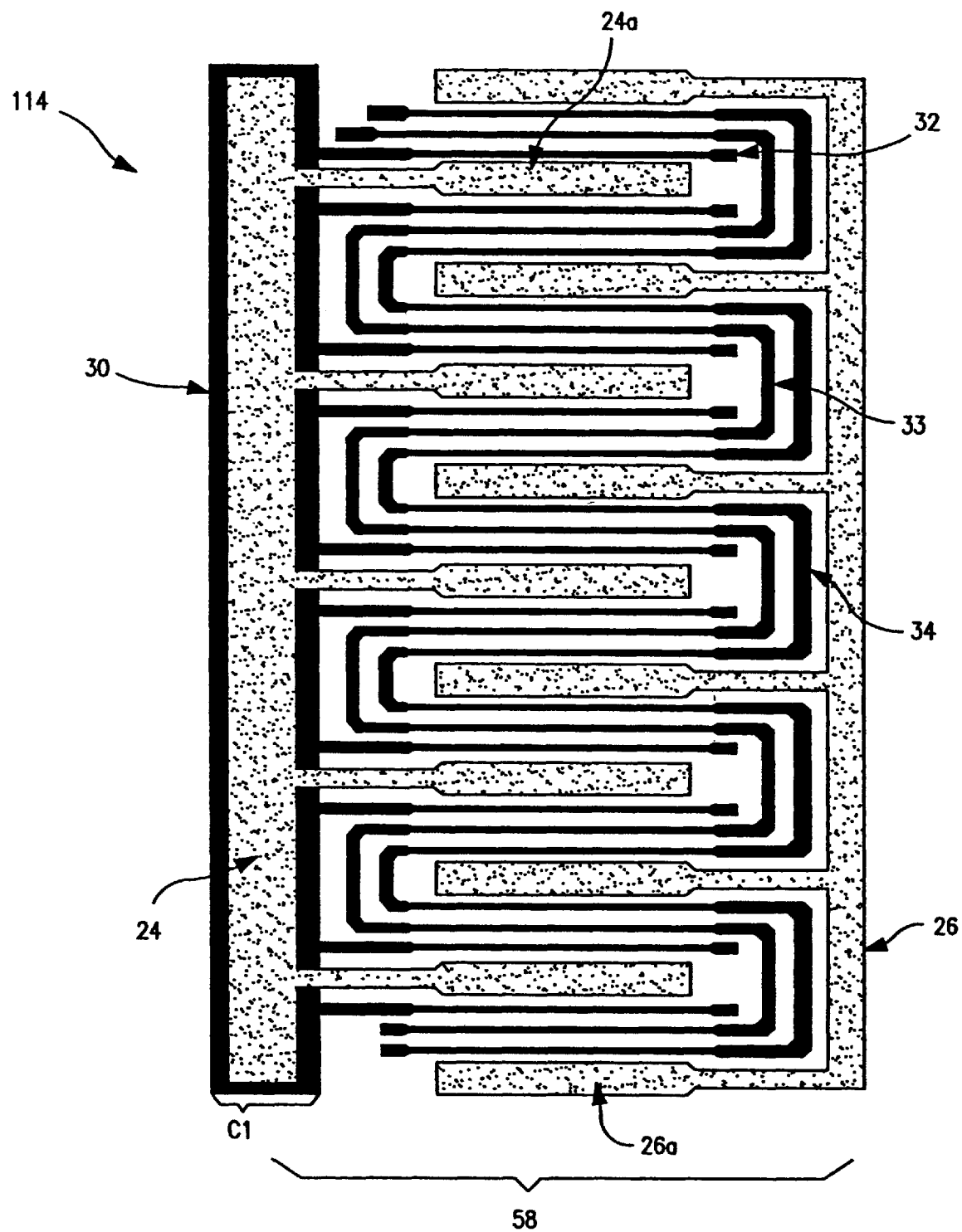
FIG. 10 is a top plan view of a FET structure according to an eighth embodiment of the present invention.

FIG. 10 is a top plan view of a multi-gate FET structure 114 according to an eighth embodiment of the present invention. The multi-gate FET structure 114 is identical to the multi-gate FET structure 112 of FIG. 9, except that the multi-gate FET structure 114 includes an additional serpentine gate 34. More specifically, as shown, the multi-gate FET structure 114 includes a feedforward capacitor C1 and a multi-gate FET 58 integrally coupled with the feedforward capacitor C1. The multi-gate FET 58 includes a drain manifold 24 having drain fingers 24a, a source manifold 26 having source fingers 26a, a bussed gate 32 having bussed gate fingers 32a directly connected to the capacitor bottom metal layer 30 of the capacitor C1, a first serpentine gate 33, and a second serpentine gate 34. The first and second serpentine gates 33 and 34 serpentine between the bussed gate fingers 32a and the drain or source fingers 24a or 26a. The direct connection of all the bussed gate fingers 32a to the bottom metal layer 30 of the feedforward capacitor C1 evenly and symmetrically distributes the feedforward capacitance of the capacitor C1 to the gate fingers 32a. This improves the performance characteristics of the FET structure 114.

Figure 11:
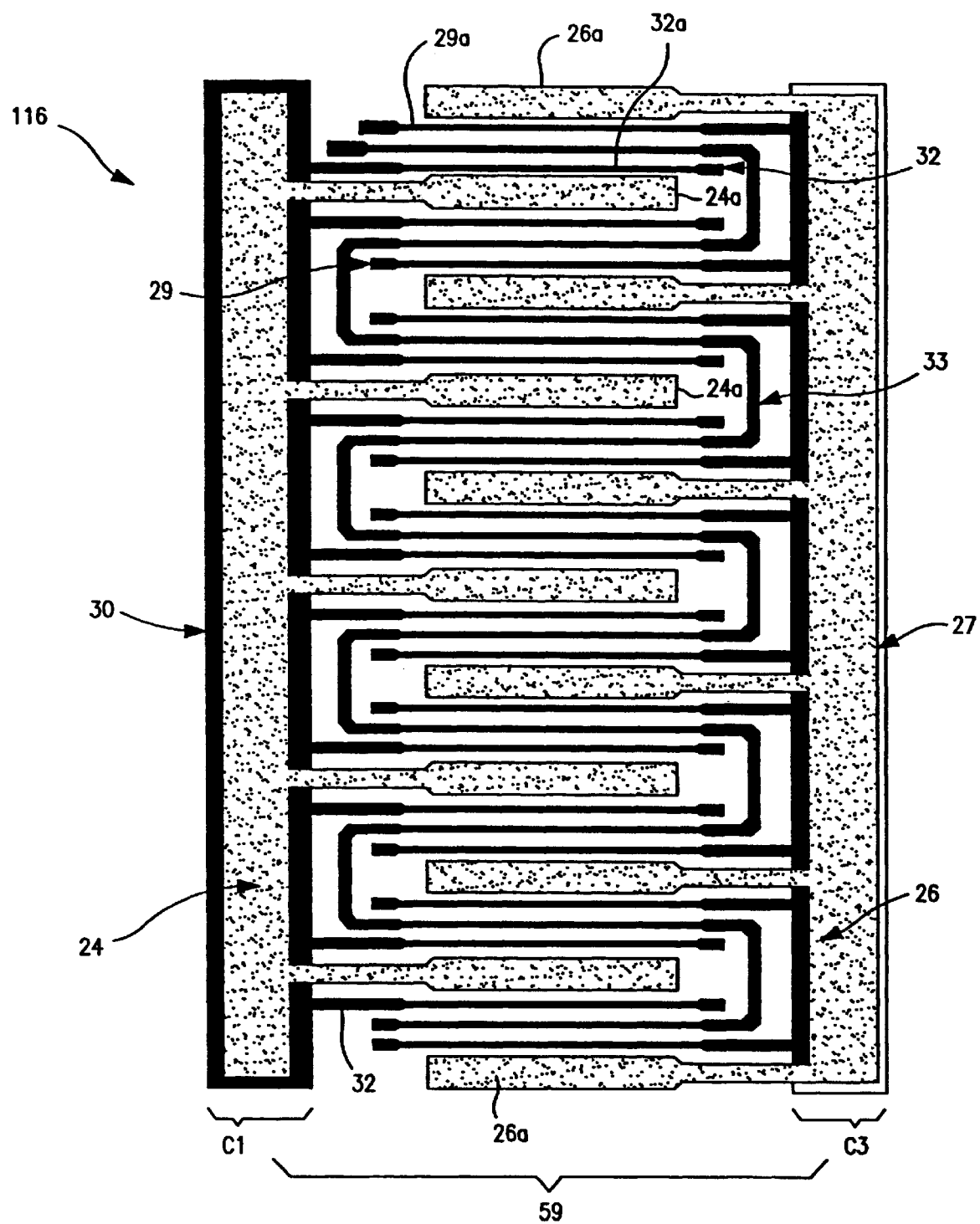
FIG. 11 is a top plan view of a FET structure according to a ninth embodiment of the present invention.

FIG. 11 is a top plan view of a multi-gate FET structure 116 according to a ninth embodiment of the present invention. In this embodiment, two bussed gates and a serpentine gate are provided. As shown, the multi-gate FET structure 116 includes first and second feedforward capacitors C1 and C3 and a multi-gate FET 59 integrally coupled with the feedforward capacitors C1 and C3. The first feedforward capacitor C1 includes a first capacitor bottom metal layer 30, a first capacitor top metal layer/drain manifold 24, and a first dielectric layer disposed between the layers 24 and 30. The second feedforward capacitor C3 includes a second capacitor bottom metal layer 27, a second capacitor top metal layer/source manifold 26, and a second dielectric layer disposed between the layers 26 and 27.

The multi-gate FET 59 includes the drain manifold 24 having drain fingers 24a, the source manifold 26 having source fingers 26a, a first bussed gate 32 having first bussed gate fingers 32a directly connected to the first capacitor bottom metal layer 30, a second bussed gate 29 having second bussed gate fingers 29a directly connected to the second capacitor bottom metal layer 27, and at least one serpentine gate 33. The serpentine gate 33 serpentines between the bussed gate fingers 32a and 29a. Since all the gate fingers 32a are directly connected to the first capacitor bottom metal layer 30 of the first feedforward capacitor C1, and since all the gate fingers 29a are directly connected to the second capacitor bottom metal layer 27 of the second feedforward capacitor C3, the feedforward capacitance effects of the capacitors C1 and C3 are evenly and symmetrically distributed to the gate fingers 32a and 29a, thereby enhancing the performance of the multi-gate FET structure 116.

One skilled in the art would readily appreciate that the feedforward capacitor connection of the present invention is applicable to any FET structures and other electronic devices which require the use of feedforward capacitor(s). Such variations are contemplated as part of the present invention. Furthermore, in all these embodiments, the drain and source are interchangeable due to the symmetric placement of gates within a channel. Moreover, the layouts provided in these embodiments can be modified and scaled to include any number of serpentine gates, serpentine gate fingers, bussed gates, bussed gate fingers, drain fingers, source fingers, drain manifolds, source manifolds, feedforward capacitors, and/or cascaded FET structures as well as any width, length, thickness, size, shape and/or configuration for any component of the FET structures. In addition, these layouts can be modified and scaled to handle any FET device periphery and capacitor combination.

Figure 1A:
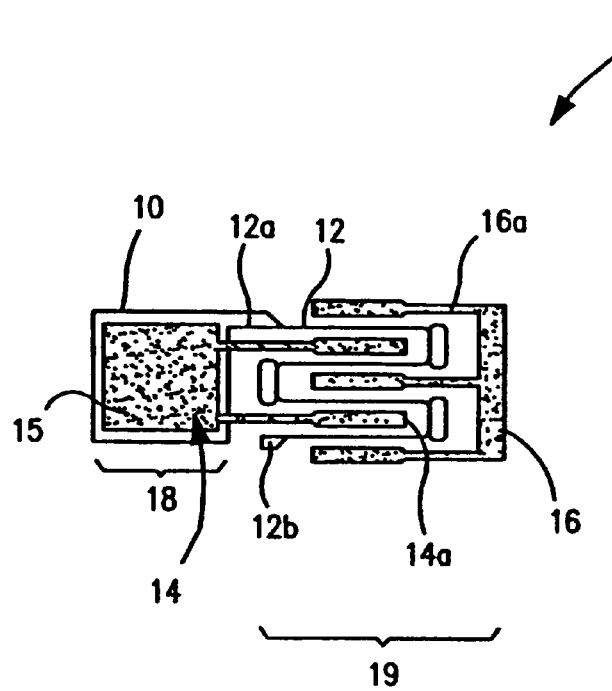
FIGS. 1A and 1B are top plan views of two different examples of conventional serpentine FET structures having conventional feedforward capacitor connections.
Figure 1B:
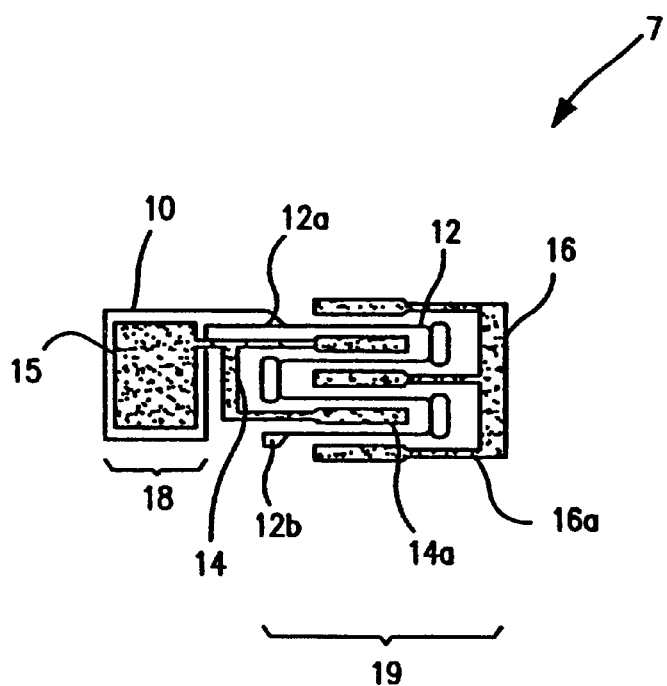

Additionally, while most of the embodiments presented herein relate to FET structures with integrally connected FET/feedforward capacitor structures, the invention is equally applicable to designs like that shown in FIG. 1B, in which the capacitor and FET are not integrally coupled in the same structure, but are still electrically coupled. What is significant is the electrical connection formed between the gate and the capacitor metal layer of choice for harmonic power improvement. The importance of the connection lies in the reduction of the effect of distributed electrical resistance along the gate. The approaches outlined in this disclosure are intended to illustrate only a few of the many various alternatives for the gate connection to the feedforward capacitor and are not intended to be limiting. The invention is not limited to any specific type of connection to either the drain or the source, nor is it limited to use in designs in which the feedforward capacitor and FET are integral in one structure.

Even further, it is not necessary to the achievement of the desired effect that the bottom layer of the capacitor be the same structure as the gate manifold or that the top layer of the capacitor be the drain/source manifold of the FET.

It should be understood that the description and specific examples, while indicating preferred embodiments of the invention, are given by way of illustration only, and various changes and modifications within the spirit and scope of the invention as apparent to those skilled in the art are contemplated as part of the present invention.

What is claimed is:

1. A structure comprising:
   a field effect transistor (FET) including a gate having a plurality of gate fingers, a plurality of source fingers, and a plurality of drain fingers; and
   a feedforward capacitor integrally coupled with the FET for evenly or symmetrically distributing capacitance of the feedforward capacitor to the gate fingers, wherein the gate is a serpentine gate serpentining between the source and drain fingers, and includes first and second ends that are connected directly to the feedforward capacitor.

2. The structure of claim 1, wherein the serpentine gate includes a middle portion that is not connected directly to the feedforward capacitor.

3. The structure of claim 1, wherein the serpentine gate includes a middle portion that is also connected directly to the feedforward capacitor.

4. The structure of claim 1, wherein the serpentine gate includes evenly distributed portions between the first and second ends, said evenly distributed portions being directly connected to the feedforward capacitor.

5. The structure of claim 1, wherein the gate is a serpentine gate serpentining between the source and drain fingers, and includes first and second ends and at least one portion between the first and second ends, wherein said at least one portion and not the first and second ends is connected directly to the feedforward capacitor.

6. The structure of claim 5, wherein said at least one portion of the serpentine gate is a middle portion of the serpentine gate, or evenly distributed portions disposed between the first and second ends of the serpentine gate.

7. The structure of claim 1, wherein the gate is a bussed gate wherein each of the plurality of gate fingers is connected directly to the feedforward capacitor.

8. The structure of claim 1, wherein the feedforward capacitor includes a bottom conductive layer, a top conductive layer, and a dielectric layer disposed between the top and bottom conductive layers.

9. The structure of claim 8, wherein the gate fingers extend from the bottom conductive layer of the feedforward capacitor, and the drain or source fingers extend from the top conductive layer of the feedforward capacitor.

10. The structure of claim 1, further comprising:
a second FET including a second gate having a plurality of second gate fingers, a plurality of second source fingers, and a plurality of second drain fingers;
a second feedforward capacitor integrally coupled with the second FET for evenly or symmetrically distributing capacitance of the second feedforward capacitor to the second gate fingers; and
at least one third FET connected between the first and second FETs and including a third gate having a plurality of third gate fingers, a plurality of third source fingers, and a plurality of third drain fingers.

11. The structure of claim 10, wherein at least one of the first and second gates is a serpentine gate having first and second ends, the first and second ends of the serpentine gate being connected directly to the first or second feedforward capacitor.

12. The structure of claim 11, wherein the third gate is a serpentine gate, and the first, second and third FETs are connected in series with each other.

13. The structure of claim 12, wherein the serpentine gate includes a middle portion that is not connected directly to the first or second feedforward capacitor.

14. The structure of claim 12, wherein the serpentine gate includes a middle portion that is connected directly to the first or second feedforward capacitor.

15. The structure of claim 12, wherein the serpentine gate further includes evenly distributed portions between the first and second ends, said evenly distributed portions being directly connected to the feedforward capacitor.

16. The structure of claim 10, wherein at least one of the first and second gates is a serpentine gate having first and second ends and at least one portion between the first and second ends, wherein said at least one portion and not the first and second ends is connected directly to the first or second feedforward capacitor.

17. The structure of claim 16, wherein said at least one portion of the serpentine gate is a middle portion of the serpentine gate, or evenly-distributed portions disposed between the first and second ends of the serpentine gate.

18. The structure of claim 10, wherein at least one of the first and second gates is a bussed gate having a plurality of bussed gate fingers that are connected directly to the first or second feedforward capacitor.

19. The structure of claim 1, wherein:
the gate is a bussed gate having the plurality of gate fingers connected directly to the feedforward capacitor, and
wherein the structure further comprises at least one second gate having a plurality of second gate fingers serpentining between the source and drain fingers of the FET.

20. The structure of claim 19, wherein the feedforward capacitor is connected directly to a first side of the FET, and wherein the structure further comprises:
a third gate having a plurality of third gate fingers; and
a second feedforward capacitor integrally coupled to a second side of the FET for evenly or symmetrically distributing capacitance of the second feedforward capacitor to the third gate fingers.

21. The structure of claim 20, wherein the second and third gates are bussed gates having bussed gate fingers.

22. The structure of claim 20, wherein the first and second sides of the FET are drain and source sides respectively, or source and drain sides respectively.

23. The structure of claim 22, wherein one gate finger of the first gate, one gate finger of each of said at least one second gate, and one gate finger of the third gate are disposed between one of the source fingers and one of the drain fingers of the FET.

* * * * *